United States Patent
Frosien

(10) Patent No.: US 6,489,621 B1
(45) Date of Patent: Dec. 3, 2002

(54) PARTICLE BEAM SYSTEM WITH A DEVICE FOR REDUCING THE ENERGY WIDTH OF A PARTICLE BEAM

(75) Inventor: Jurgen Frosien, Riemerling (DE)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/400,929

(22) Filed: Sep. 22, 1999

(30) Foreign Application Priority Data

Sep. 23, 1998 (EP) .............................. 98118000

(51) Int. Cl.$^7$ ........................ H01J 37/145; H01J 37/244
(52) U.S. Cl. ..................................... 250/397; 250/396 R
(58) Field of Search ............................... 250/306, 310, 250/397, 396 R

(56) References Cited

U.S. PATENT DOCUMENTS

| | | | | |
|---|---|---|---|---|
| 4,962,313 A | * | 10/1990 | Rose | 250/396 R |
| 5,422,486 A | * | 6/1995 | Herrmann et al. | 250/396 R |
| 5,502,306 A | * | 3/1996 | Meisburger et al. | 250/397 |
| 5,838,011 A | * | 11/1998 | Krijin et al. | 250/396 R |

FOREIGN PATENT DOCUMENTS

| | | | |
|---|---|---|---|
| EP | 0 989 584 | * | 3/2000 |
| JP | 01264149 | * | 10/1989 |
| JP | 05290800 | * | 11/1993 |
| JP | 2000228162 | * | 8/2000 |

OTHER PUBLICATIONS

Harald Rose, Dieter Krahl, Energy–Filtering Transmission Electron Microscopy, Springer Series in Optical Sciences, vol. 71.

* cited by examiner

Primary Examiner—Bruce Anderson
(74) Attorney, Agent, or Firm—Muramatsu & Associates

(57) ABSTRACT

A device for reducing the energy width of a particle beam with a $1^{st}$ and a $2^{nd}$ Wien filter for dispersing the particle beam depending on the energy of the particles, and an aperture for selecting the particles within a certain reduced energy width. The device has the same functionality as one single Wien filter having the source of the particle beam at its center. Another aspect is a particle beam system with such a device for reducing the energy width of the particle beam.

9 Claims, 4 Drawing Sheets

PARTICLE BEAM SYSTEM WITH A DEVICE FOR REDUCING THE ENERGY WIDTH OF A PARTICLE BEAM

FIELD OF THE INVENTION

The invention relates to a particle beam system with a device for reducing the energy width of a particle beam.

BACKGROUND OF THE INVENTION

In particle beam systems and especially in electron optical systems, it will be advantageous to increase the resolution of the system, in particular to reduce the spot diameter in low-voltage applications.

In low-voltage electron beam systems (beam energy below 5 keV), in particular in low-voltage secondary electron microscopes and related test and inspection systems, the system resolution which means the minimum achievable spot diameter D, is limited by the geometric spot diameter $D_{geo}$, the chromatic aberration error $D_{chrom}$ and the spherical aberration error $D_{sph}$ of the objective lens involved:

$$D = \sqrt{D^2_{geo} + D^2_{chrom} + D^2_{sph}}$$

The contribution of spherical aberration error $D_{sph}$ can be neglected in low-voltage applications. The geometric spot diameter $D_{geo}$ is defined by the diameter of the particle beam source and by the source demagnification of the optics involved.

The chromatic aberration contribution $D_{chrom}$ is determined by the following dependency:

$$D_{chrom} = C_{chrom} \alpha \Delta E / E$$

with $C_{chrom}$: chromatic aberration coefficient of objective lens

α: aperture angle of objective lens

E: primary beam energy

ΔE: energy width of primary beam

In order to increase resolution or reduce probe diameter at low beam energy E,
1. $C_{chrom}$ has to be made small, which can be achieved by good low-voltage lenses, such as single pole lenses or combined electrostatic-magnetic objective lenses or by correction means as described in EP-A-0 373 399,
2. α has to be reduced which, however, is limited by the diffraction aberration which increases with decreasing α and
3. ΔE has to be reduced. This is normally done by applying electron sources with low energy width, e.g. cold and thermal field emission cathodes or photocathodes.

In order to reduce the spot diameter D (which means $D_{chrom}$) further, devices have to be provided in the particle beam system which reduce ΔE of the primary beam.

In commercial low-voltage secondary electron microscopes and related equipment, no devices for reducing energy width have been realized until now, in spite of the fact that solutions are widely discussed. JP-A-1 264 149 relates to a charged particle beam system according to the preamble to claim 1. In the embodiment with merely two filters, the particle beam is deflected in that the beam seems to come from the center of the aperture arranged between the two filters.

Basically, a large number of monochromators and energy filters are known which are applied in transmission electron microscopes. An overview of such filters can be seen in: L. Reimer, "Energy-filtering transmission electron microscopy", Springer Series in Optical Sciences, Vol. 71, 1994.

One of those energy filters mentioned is a Wien filter, which consists of crossed electrostatic and magnetic deflection fields perpendicular to the optical axis of the particle beam system (see FIG. 1 and FIG. 2).

FIG. 3 demonstrates the effect of a Wien filter 1 on a primary beam 2 generated by a source 3. Both the electrostatic and the magnetic field of the Wien filter 1 will deflect the particle beam. In the case where the electrostatic and magnetic fields will act in opposite directions, the primary beam (in first approximation) will not be deflected. This condition, however, is only true for one beam energy $E_0$. For a beam having an energy width ΔE, the condition does not hold and the beam disperses as shown in FIG. 3. The degree of deflection of each particle will depend on its energy. By placing an aperture 4 at some distance from the Wien filter, only a certain energy range of the beam can pass. The other energies are stopped at the aperture 4. By this effect, the energy width of the primary particle beam 2 can be reduced or, in other words, the beam can be monochromated.

However, since energy dispersion is performed by beam deflection, not only an angular spread according to beam energy is performed, but also the image of the electron source is enlarged (see FIG. 4). Each non-matching energy seems to have a different off-axial image location.

This can only be avoided if an intermediate image of the source 3 is located in the center of the Wien filter as shown in FIG. 5. In this case, energy-dependent image enlargement can be avoided. Such an arrangement, however, needs a cross-over in the center of the Wien filter. However, each cross-over increases the electron-electron interaction which increases spot diameter especially in low-voltage systems by two effects:
1. Increasing the energy width of the primary beam, which happens in the beam path mainly in the cross-over,
2. increasing the spot diameter by electron repulsion during the total beam path.

Accordingly, low-voltage systems should avoid or minimize the number of cross-overs and must be as short as possible. According to these design rules, the device for reducing the energy width should avoid additional cross-overs and should not increase the length of the optical system.

Therefore, the best location of the Wien filter would be the source of the primary beam itself, which, however, is not practicable, especially in those cases in which a field emission source is used. Such cathodes have no real but a virtual source position, which is located inside the corpus of the emitter and which is, therefore, not accessible.

SUMMARY OF THE INVENTION

The object of the invention is to provide a device for reducing the energy width in a particle beam system without having drawbacks on the system resolution caused by other aberrations or limitations.

The two Wien filters have electrostatic and magnetic field directions acting on the particles in opposite deflection directions. Correspondingly, those particles which are deflected in the $1^{st}$ Wien filter to the left are deflected in the $2^{nd}$ Wien filter to the right and vice versa. The field strength of the $2^{nd}$ Wien filter is excited in such a way that all particles seem to come from the source. Such an arrangement has the same functionality as one single Wien filter in the real or virtual source position.

BRIEF DESCRIPTION OF THE DRAWINGS

Further embodiments and advantages of the invention are explained in greater detail below with reference to the drawings, in which.

DETAILED DESCRIPTION OF THE INVENTION

Figure 6:
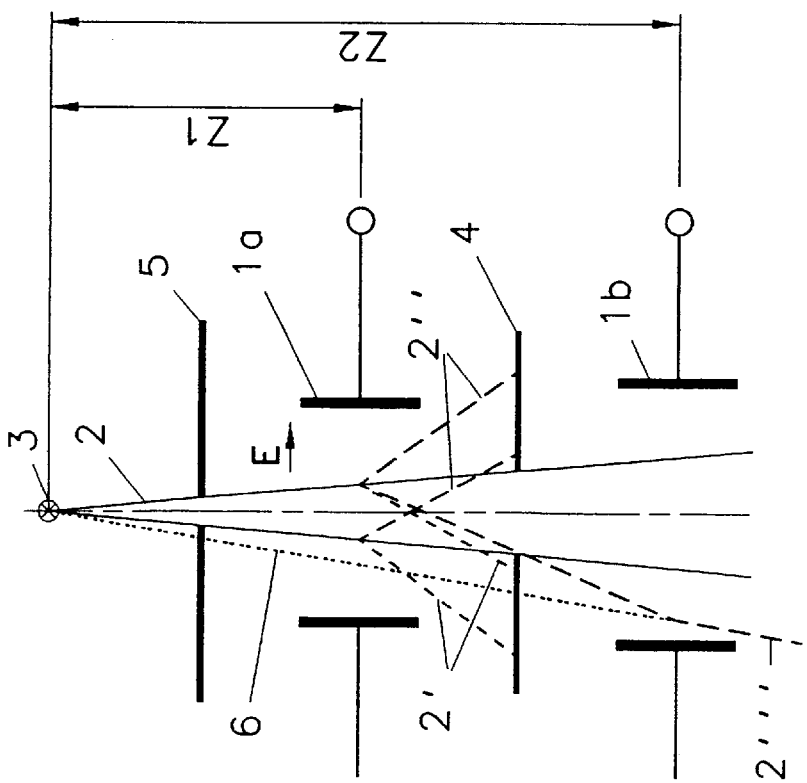
FIG. 6 shows a schematic representation of the device for reducing the energy width according to a first embodiment

FIG. 6 discloses a first embodiment of a device for reducing the energy width of a particle beam 2. It comprises a $1^{st}$ and a $2^{nd}$ Wien filter 1a, 1b for dispersing the particle beam depending on the energy of the particles and an aperture 4 for selecting the particles within a certain reduced energy width.

An additional aperture 5 for limiting the bundle of the particle beam 2 is arranged before the $1^{st}$ Wien filter 1a.

The aperture 4 for selecting the particles is arranged in the direction of the particle beam 2 between the two Wien filters 1a, 1b.

Both the electrostatic and the magnetic field of each Wien filter will deflect the particle beam. In the case where these fields act in opposite directions on the particles, the primary beam (in first approximation) will not be deflected. This condition, however, is only true for one certain beam energy. For a beam having an energy width $\Delta E$, the condition does not hold and the beam disperses as shown by dotted lines 2', 2" in FIG. 6.

Those particles which are not deflected by the $1^{st}$ Wien filter 1a have an energy $E_0$. Those particles 2' which are deflected to the left in FIG. 6 have an energy $E_1 < E_0$ and those particles 2" which are deflected to the right have an energy $E_2 > E_0$. The deflection degree depends on the difference of the energy of the particle from the energy $E_0$.

Figure 2:
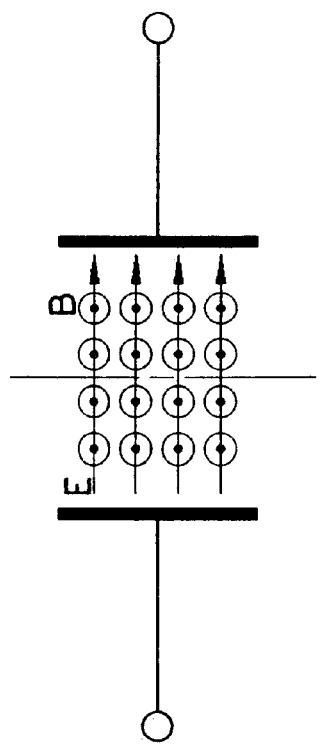
FIG. 2 shows a sectional representation of the Wien filter according to FIG. 1.
Figure 1:
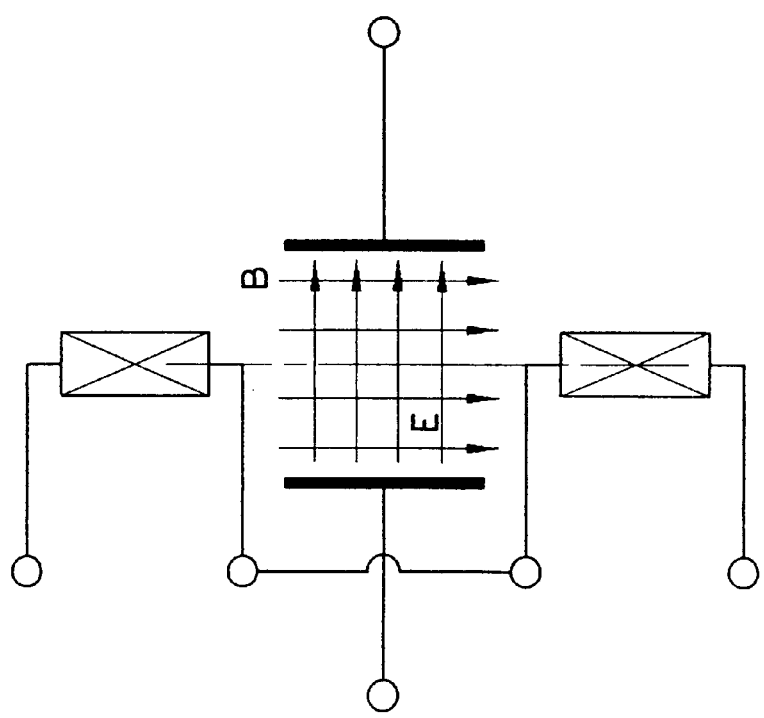
FIG. 1 shows a top view of a Wien filter.
Figure 4:
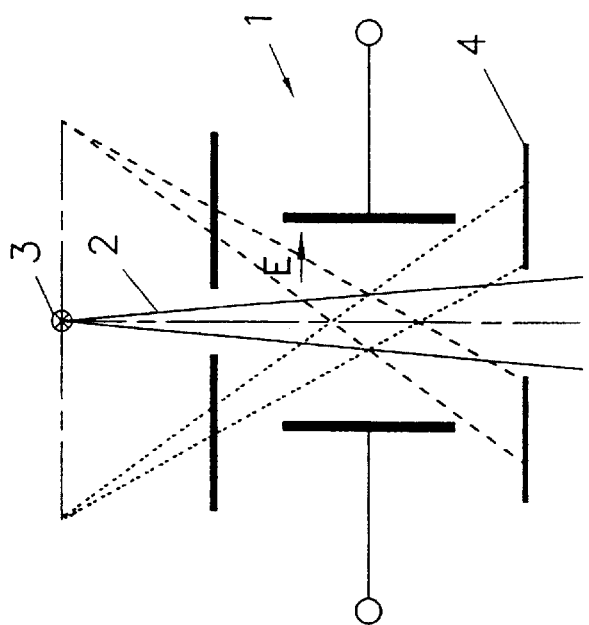
FIG. 4 shows a schematic representation of the Wien filter demonstrating the source enlargement.
Figure 3:
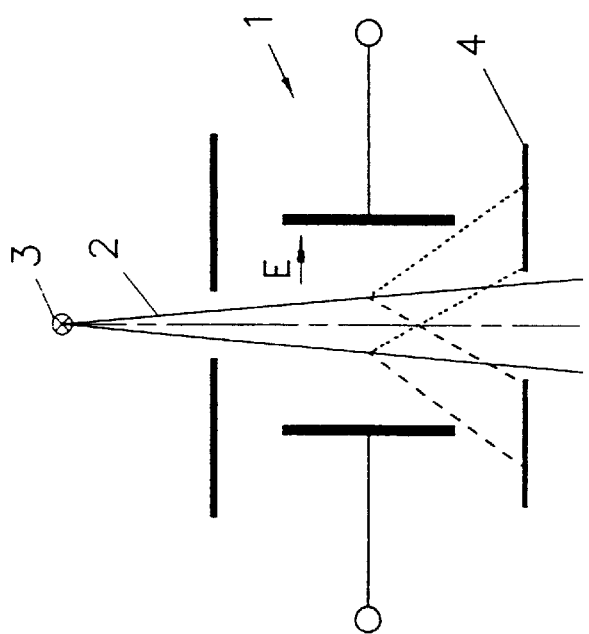
FIG. 3 shows a schematic representation of a Wien filter demonstrating the spreading of the particle beam.
Figure 5:
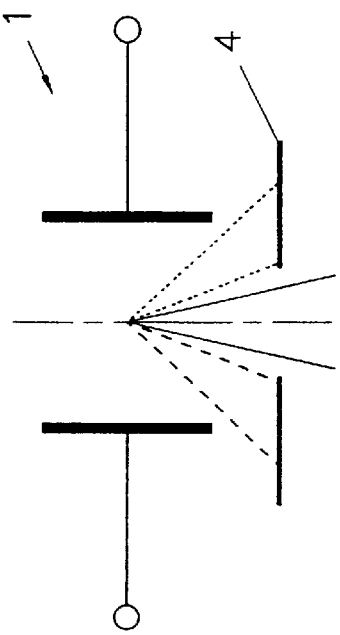
FIG. 5 shows a schematic representation of the ideal location of a Wien filter.

By placing the aperture 4 at such a distance from the $1^{st}$ Wien filter 1a, only those particles within a certain energy width can pass. The other particles will be stopped at the aperture. By this effect, the energy width of the primary beam 2 can be reduced. If only one Wien filter is used, an energy-dependent image enlargement cannot be avoided (see FIG. 4). Therefore, the $2^{nd}$ Wien filter 1b is arranged after the $1^{st}$ Wien filter 1a. Preferably, the electrostatic and magnetic fields of the two Wien filters act on the particles in opposite deflection directions. Correspondingly, those particles which are deflected in the $1^{st}$ Wien filter 1a to the left are deflected in the $2^{nd}$ Wien filter to the right and vice versa. The field strength of the $2^{nd}$ Wien filter 1b is excited in such a way that the excitation of the $2^{nd}$ Wien filter 1b is less than the excitation of the $1^{st}$ Wien filter 1a. The exact excitation of the $2^{nd}$ Wien filter 1b depends on its position with respect to the $1^{st}$ Wien filter 1a and the source. E.g. for $Z2 = 2 \cdot Z1$, the excitation of the $2^{nd}$ Wien filter 1b is less than 0.5 times the excitation of the $1^{st}$ Wien filter 1a. However, other combinations are possible, depending on the geometry.

The field strength of the $2^{nd}$ Wien filter 1b is excited in such a way that the particles, for instance 2''', are directed by the two filters so that they seem to come from one source as indicated by the dotted line 6.

Figure 7:
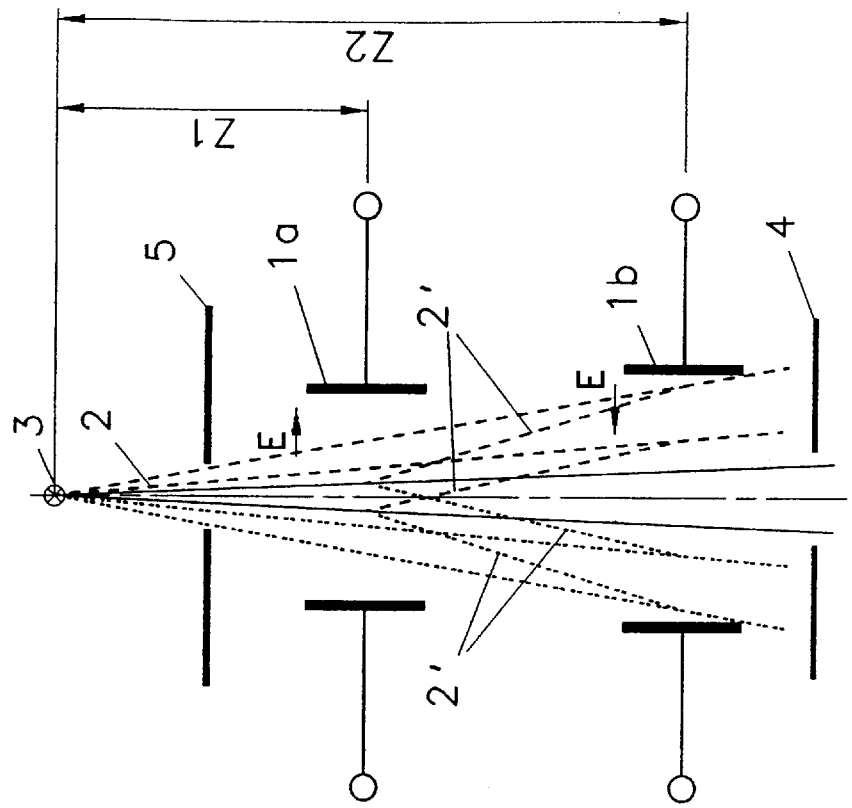
FIG. 7 shows a schematic representation of the device for the reducing energy width according to a second embodiment.

FIG. 7 shows a second embodiment of the device for reducing the energy width of a particle beam. The two embodiments differ from one another only in the position of the aperture 4 for selecting the particles within a certain reduced energy width. According to the embodiment of FIG. 7, the aperture 4 is arranged after the two Wien filters 1a, 1b. This arrangement has the advantage that the bundle of the primary beam after the device for reducing the energy width is more distinct.

Both embodiments have the same effect as an arrangement using one Wien filter which is positioned in the real or virtual source position. Furthermore, no additional crossover is required.

It is possible to excite the two Wien filters together according to a fixed ratio in order to vary the energy width of the particle beam. The Wien filter may be a quadrupole filter or an arrangement of an even higher order. The two Wien filters preferably generate homogeneous electrostatic and magnetic fields.

Furthermore, it is possible to shape the electrostatic and/or magnetic fields in order to reduce aberrations which are introduced by the device and which consequently would virtually increase the source size.

Figure 8:
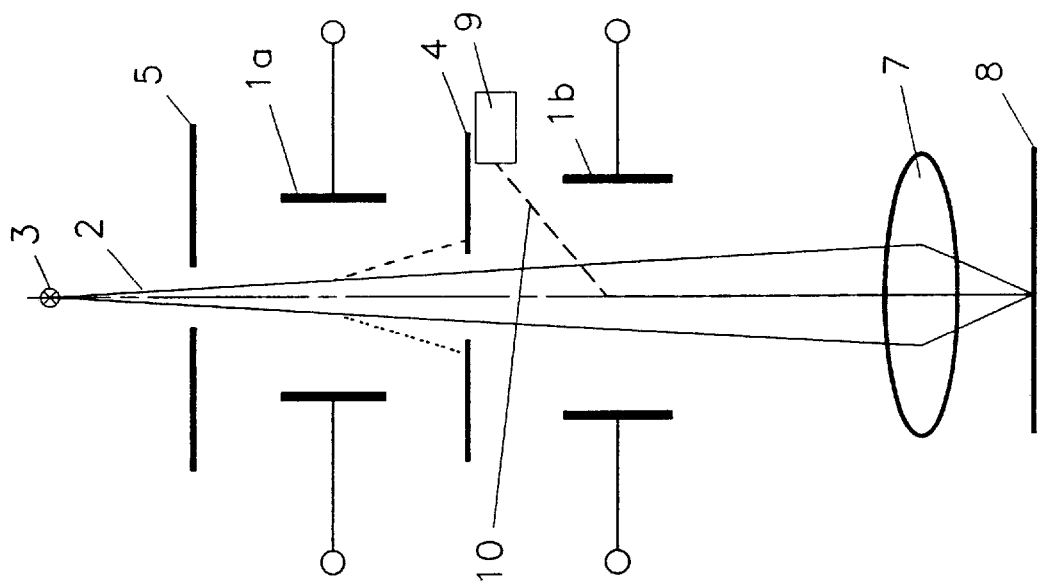
FIG. 8 shows a schematic representation of a particle beam system with a device for reducing the energy width according to FIG. 7

FIG. 8 discloses a particle beam system with a source 3 for generating a particle beam, an objective lens 7 for focussing the particle beam onto a specimen 8 and a detector 9 for receiving backscattered and/or secondary particles 10 released at the specimen 8. Furthermore, the particle beam system has a device for reducing the energy width according to the embodiment of FIG. 7.

Figure 9:
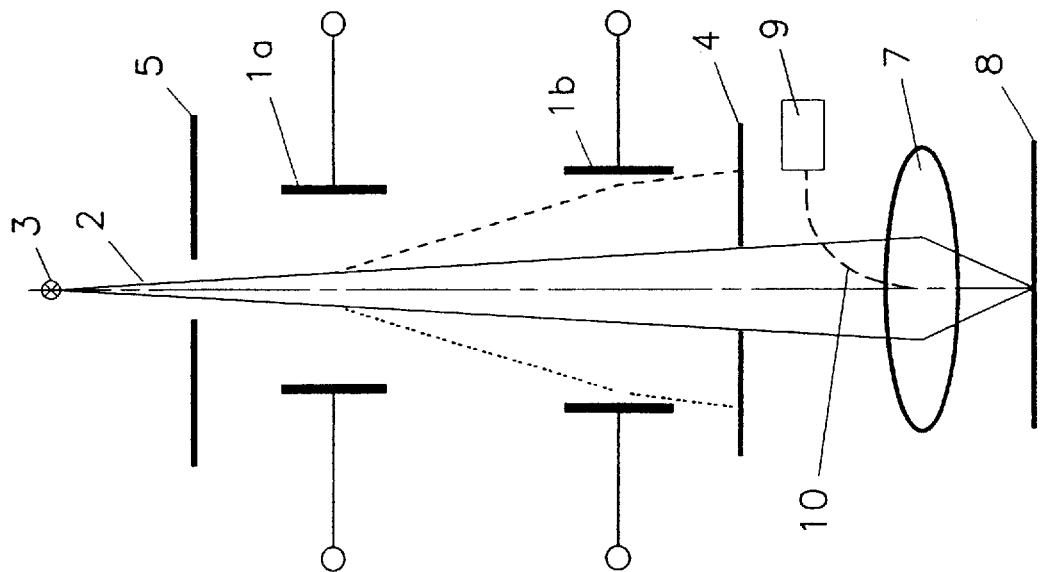
FIG. 9 shows a schematic representation of a further particle beam system with a device for reducing the energy width according to FIG. 6.

The particle beam system according to FIG. 9 has a device for reducing the energy width of the particle beam 2 according to the embodiment of FIG. 6. Furthermore, the detector 9 is arranged between the two Wien filters while the detector 9 of the system according to FIG. 8 is arranged after the aperture 4 in the direction of the particle beam 2.

The backscattered and/or secondary particles 8 released at the specimen 8 will be deflected by the second Wien filter 1b and reach the detector 9. The primary particle beam 2 passes the $1^{st}$ and the $2^{nd}$ Wien filter 1a, 1b and, therefore, is not deflected by the filters but merely dispersed.

The two particle beam systems shown in FIGS. 8 and 9 are especially suitable for low-voltage applications using an electron source, such as a cold or thermal field emission or photocathode. The objective lens 7 may be a magnetic or electrostatic lens or a combined electrostatic-magnetic lens.

Preferably, the particle beam system uses a high beam energy which is reduced to the final energy inside the system, preferably inside the objective lens. Accordingly, the device for reducing the energy width is in the high energy region. Furthermore, the energy of the particle beam system is fixed independently of the final beam energy which keeps the excitation conditions of the device for reducing the energy width independent of the final beam energy.

The $1^{st}$ and/or the $2^{nd}$ Wien filter 1a, 1b may also serve as a deflector for deflecting the particle beam on the specimen 8 and/or for scanning the beam. Consequently, the length of the optical system will not be increased by these additional devices.

What is claimed is:

1. A particle beam system comprising:

a source for generating a particle beam;

an objective lens for focusing the particle beam onto a specimen;

a detector for receiving backscattered and/or secondary particles released at the specimen;

a device for reducing the energy width comprising solely of a $1^{st}$ and a $2^{nd}$ Wien filter for dispersing the particle beam depending on the energy of the particles;

a first aperture for selecting the particles within a certain reduced energy width; and a second aperture for limiting the bundle of the particle beam arranged before the $1^{st}$ Wien filter in the direction of the particle beam;

wherein electrostatic and magnetic fields of the two Wien filters act on the particles in opposite deflection directions, the $2^{nd}$ Wien filter is arranged and excited with respect to the $1^{st}$ Wien filter in that the particles are directed by the two filters so that they seem to come from said source.

2. A particle beam system as claimed in claim 1, wherein said first aperture for selecting the particles within a certain reduced energy width is arranged between the two Wien filters.

3. A particle beam system as claimed in claim 1, wherein said first aperture for selecting the particles within a certain reduced energy width is arranged in the direction of the particle beam after the two Wien filters.

4. A particle beam system as claimed in claim 1, wherein the two Wien filters are excited together according to a fixed ratio to vary the energy width of the particle beam.

5. A particle beam system as claimed in claim 1, wherein the two Wien filters generate homogeneous electrostatic and magnetic fields.

6. A particle beam system as claimed in claim 1, wherein the Wien filter consists of a quadrupole filter.

7. A particle beam system as claimed in claim 1, wherein the two Wien filters generate shaped electrostatic and magnetic fields.

8. A particle beam system as claimed in claim 1, wherein said detector is arranged between the two Wien filters.

9. A particle beam system as claimed in claim 1 wherein the $1^{st}$ and the $2^{nd}$ Wien filter also serve as a deflector for deflecting the particle beam on the specimen.

* * * * *